United States Patent
Jang et al.

(10) Patent No.: US 9,184,358 B2
(45) Date of Patent: Nov. 10, 2015

(54) LEAD FRAME AND LIGHT EMITTING DIODE PACKAGE HAVING THE SAME

(71) Applicant: ADVANCED OPTOELECTRONIC TECHNOLOGY, INC., Hsinchu Hsien (TW)

(72) Inventors: Yau-Tzu Jang, Hsinchu (TW);
Yu-Liang Huang, Hsinchu (TW);
Wen-Liang Tseng, Hsinchu (TW);
Pin-Chuan Chen, Hsinchu (TW);
Lung-Hsin Chen, Hsinchu (TW);
Hsing-Fen Lo, Hsinchu (TW);
Chao-Hsiung Chang, Hsinchu (TW);
Che-Hsang Huang, Hsinchu (TW);
Yu-Lun Hsieh, Hsinchu (TW)

(73) Assignee: ADVANCED OPTOELECTRONIC TECHNOLOGY, INC., Hsinchu Hsien (TW)

( * ) Notice: Subject to any disclaimer, the term of this patent is extended or adjusted under 35 U.S.C. 154(b) by 11 days.

(21) Appl. No.: 14/059,463

(22) Filed: Oct. 22, 2013

(65) Prior Publication Data
US 2014/0167078 A1 Jun. 19, 2014

(30) Foreign Application Priority Data
Dec. 18, 2012 (CN) .......................... 2012 1 05511023

(51) Int. Cl.
*H01L 33/62* (2010.01)
*H01L 25/075* (2006.01)
*H01L 33/60* (2010.01)

(52) U.S. Cl.
CPC ............ *H01L 33/62* (2013.01); *H01L 25/0753* (2013.01); *H01L 33/60* (2013.01); *H01L 2224/48137* (2013.01)

(58) Field of Classification Search
CPC ................ H01L 33/62; H01L 25/0753; H01L 2224/48137
USPC .............................................................. 257/88
See application file for complete search history.

(56) References Cited

U.S. PATENT DOCUMENTS

2010/0213475 A1 8/2010 Son
2012/0262941 A1* 10/2012 Min .............................. 362/607

FOREIGN PATENT DOCUMENTS

TW 200929595 A 7/2009
TW 201218359 A1 5/2012

* cited by examiner

*Primary Examiner* — Steven Loke
*Assistant Examiner* — Arash Majdi
(74) *Attorney, Agent, or Firm* — Novak Druce Connolly Bove + Quigg LLP

(57) ABSTRACT

An exemplary lead frame includes a substrate and a bonding electrode, a first connecting electrode, and a second connecting electrode embedded in the substrate. A top surface of the bonding electrode includes a first bonding surface and a second bonding surface spaced from the first bonding surface. A top surface of the first connecting electrode includes a first connecting surface and a second connecting surface spaced from the first connecting surface. Top surfaces of the bonding electrode, the first connecting electrode and the second connecting electrode are exposed out of the substrate to support and electrically connect with light emitting chips. Light emitting chips can be mounted on the lead frame and electrically connect with each other in parallel or in series; thus, the light emitting chips can be connected with each in a versatile way.

12 Claims, 12 Drawing Sheets

LEAD FRAME AND LIGHT EMITTING DIODE PACKAGE HAVING THE SAME

BACKGROUND

1. Technical Field

The disclosure generally relates to a lead frame and a light emitting diode package having the lead frame, wherein the light emitting diode package can have advantages of better heat dissipation and versatile electrical wiring.

2. Description of Related Art

A typical light emitting diode package includes a substrate, a first electrode and a second electrode arranged on the substrate, and plural light emitting chips mounted on the substrate and electrically connecting with the first and second electrodes.

However, in a typical light emitting diode (LED) package, only two electrodes are provided to supply electricity to the light emitting chips, such that, the plural light emitting chips can only be connected in parallel with a power source, which limits the connecting ways of the light emitting chips. Furthermore, the typical LED package has a limited heat dissipation area and accordingly a poor heat dissipation capability which adversely affects the useful life and reliability of the typical LED package.

What is needed, therefore, is a lead frame and a light emitting diode package having the lead frame which can overcome the above-described shortcomings.

DETAILED DESCRIPTION

Exemplary embodiments of a lead frame and a light emitting diode package having the lead frame in accordance with the present disclosure will now be described in detail below and with reference to the drawings.

Figure 1:
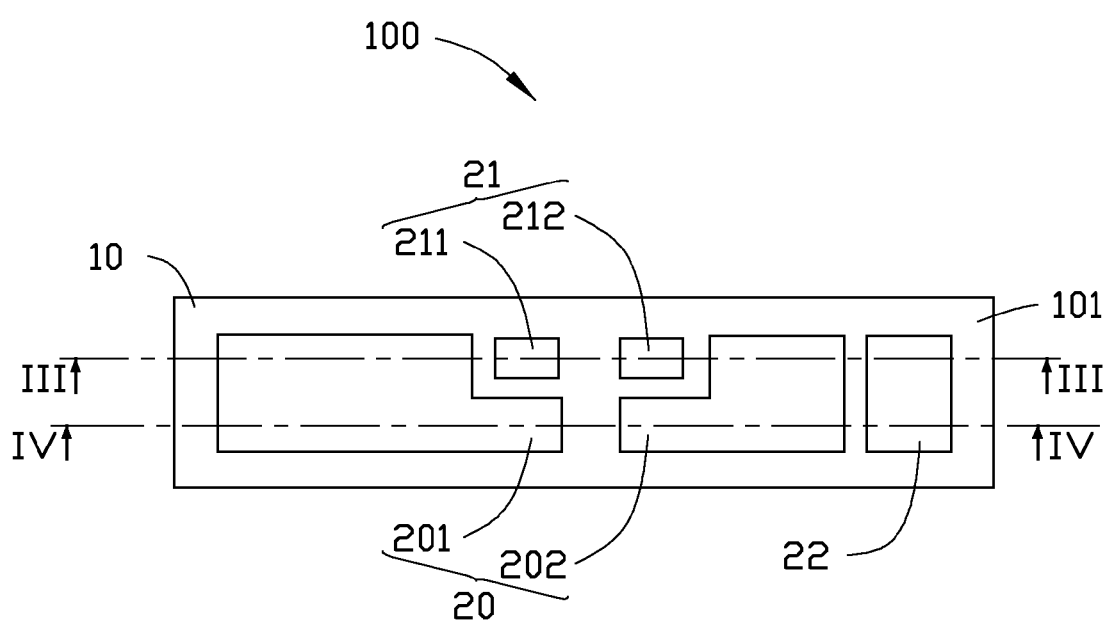
FIG. 1 is a top view of a lead frame in accordance with an exemplary embodiment of the present disclosure.
Figure 2:
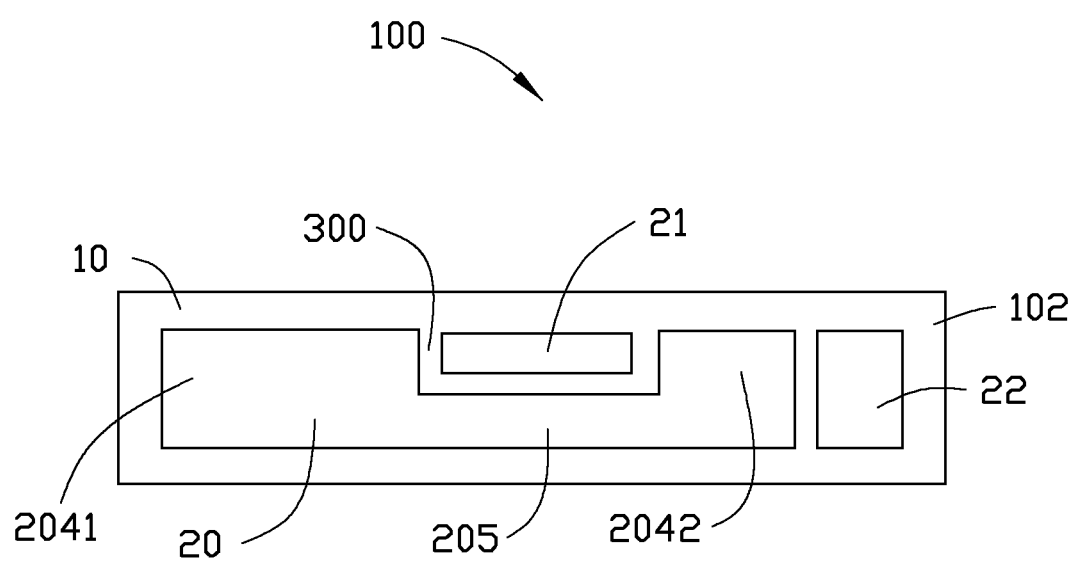
FIG. 2 is a bottom view of the lead frame of FIG. 1.

Referring to FIGS. 1-2, a lead frame 100 in accordance with an exemplary embodiment of the present disclosure is provided. The lead frame 100 includes a substrate 10, a bonding electrode 20, a first connecting electrode 21 and a second connecting electrode 22. The bonding electrode 20, the first connecting electrode 21 and the second connecting electrode 22 are spaced from each other.

The substrate 10 includes a flat top surface 101 and a flat bottom surface 102 opposite and parallel to the top surface 101.

The bonding electrode 20, the first connecting electrode 21 and the second connecting electrode 22 are embedded in the substrate 10, and each have the same thickness with the substrate 10. That is, top surfaces of the bonding electrode 20, the first connecting electrode 21 and the second connecting electrodes 22, are coplanar with and exposed out of the top surface 101 of the substrate 10; and bottom surfaces of the bonding electrode 20, the first connecting electrode 21 and the second connecting electrode 22, are coplanar with and exposed out of the bottom surface 102 of the substrate 10.

The bonding electrode 20 includes a first connecting portion 2041, a second connecting portion 2042 and a main connecting portion 205 connecting the first and second connecting portions 2041, 2042.

The first and second connecting portions 2041, 2042 are spaced from each other, and are paralleled to each other. The main connecting portion 205 is located between the first and second connecting portions 2041, 2042. Opposite ends of the main connecting portion 205 connects inner ends of the first and second connecting portions 2041, 2042 respectively.

A width of the first connecting portion 2041 equals a width of the second connecting portion 2042, and is larger than a width of the main connecting portion 205. Such that, a recess 300 is defined among the first connecting portion 2041, the second connecting portion 2042 and the main connecting portion 205.

In this embodiment, the first and second connecting portions 2041, 2042 are integrally formed with the main connecting portion 205 as a single piece.

The first connecting electrode 21 is located in the recess 300, and is surrounded by the first connecting portion 2041, the second connecting portion 2042 and the main connecting portion 205. The first connecting electrode 21 is spaced from the first connecting portion 2041, the second connecting portion 2042 and the main connecting portion 205.

In this embodiment, the second connecting electrode 22 is located at a right side of the bonding electrode 20 along a longitudinal direction of the substrate 10, and is spaced from the bonding electrode 20. The bottom surface of the bonding electrode 20 occupies more than eighty percent of the entire area of the lead frame 100. The bonding electrode 20, the first connecting electrode 21 and the second connecting electrode 22 are made of metal materials with good thermal conductivity.

Figure 4:
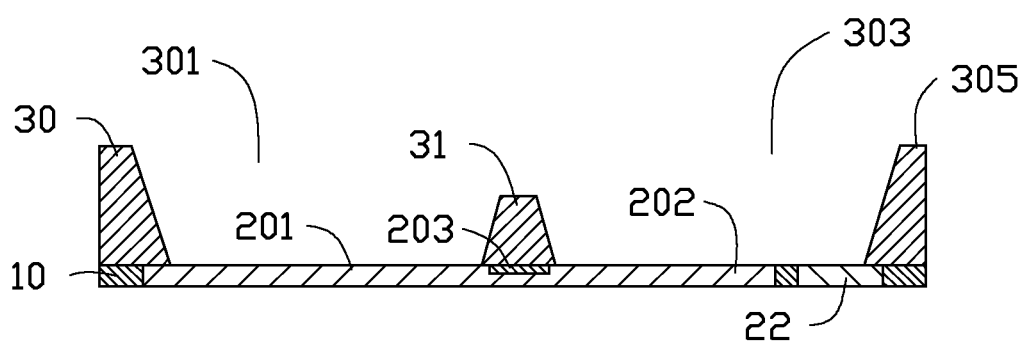
FIG. 4 is a cross-sectional view of the lead frame of FIG. 1 with a reflecting cup thereon, taken along a line IV-IV thereof.

Referring to FIG. 4, a cavity 203 is defined in a top end of the main connecting portion 205 of the bonding electrode 20 along a width direction of the bonding electrode 20. The cavity 203 is recessed downwardly along a direction from a top surface of the bonding electrode 20 towards a bottom surface of the main connecting portion 205. The cavity 203 does not penetrate through the bonding electrode 20 along a thickness direction. Preferably, a depth of the cavity 203 equals a half of the thickness of the bonding electrode 20.

In this embodiment, the top surface of the bonding electrode 20 is divided by the cavity 203 to have a first bonding surface 201 and a second bonding surface 202.

Figure 3:
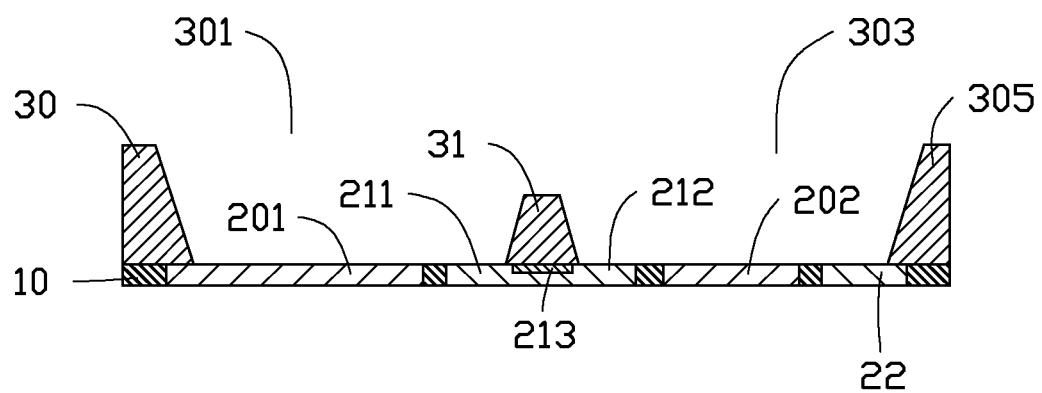
FIG. 3 is a cross-sectional view of the lead frame of FIG. 1 with a reflecting cup thereon, taken along a line III-III thereof.

Referring to FIG. 3, a groove 213 is defined through a top end of the first connecting electrode 21 along a transverse direction of the substrate 10. The groove 213 is recessed downwardly along a direction from the top surface of the first connecting electrode 21 towards the bottom surface of the first connecting electrode 21. The groove 213 does not penetrate through the first connecting electrode 21 along a thickness direction of the first connecting electrode 21. Preferably, a depth of the groove 213 equals the depth of the cavity 203 in the bonding electrode 20, a width of the groove 213 equals that of the cavity 203 in the bonding electrode 20. In this embodiment, the cavity 203 is aligned with the groove 213 along the longitudinal direction of the substrate 10.

Because of the groove 213, the top surface of the first connecting electrode 21 is divided to have a first connecting surface 211 and a second connecting surface 212 located at opposite sides of the groove 213.

A reflector 30 is located on the top surface 101 of the substrate 10. The reflector 30 covers an outer periphery of the bonding electrode 20, an outer periphery of the first connecting electrode 21 and an outer periphery of the second connecting electrode 22.

The reflector 30 is made of polymeric materials, such as EMC (Epoxy Molding Compound) or SMC (Silicone Molding Compound).

In this embodiment, the reflector 30 includes a first receiving portion 301 and a second receiving portion 303 separated from the first receiving portion 301 by a dam 31. The dam 31 is located at a central portion of the reflector 30. The dam 31 extends along the transverse direction of the substrate 10, and is over the cavity 203 and the groove 213. A part of the substrate 10 fills in the cavity 203 and the groove 213.

A width of the dam 31 gradually decreases from a bottom end on the substrate 10 towards a top end far away from the substrate 10. The width of the bottom end of the dam 31 is larger than the width of the cavity 203, but less than the width of the first connecting electrode 21 along the longitudinal direction of the substrate 10.

The first bonding surface 201 of the bonding electrode 20 and the first connecting surface 211 of the first connecting electrode 21 are exposed at the bottom of the first receiving portion 301 of the reflector 30; the second bonding surface 202 of the bonding electrode 20, the second connecting surface 212 of the first connecting electrode 21, and the top surface of the second connecting electrode 22 are exposed at the bottom of the second receiving portion 303 of the reflector 30. In this embodiment, a height of the dam 31 is less than a height of the surrounding portion 305 the reflector 30.

Alternatively, the reflector 30 is formed with the substrate 10 as a single piece and is made of a polymer material layer, wherein the reflector 30 and the substrate 10 are made of the same material.

Figure 5:
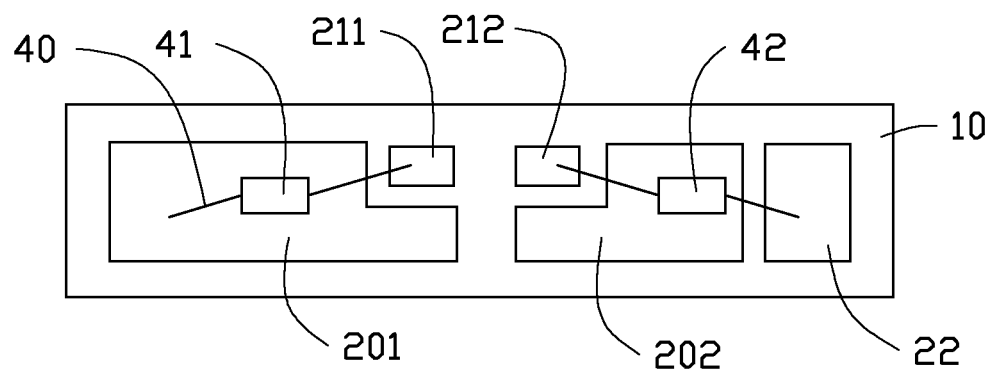
FIG. 5 is a top view of a light emitting diode package having two light emitting chips electrically connecting with each other in series on the lead frame of FIG. 1.
Figure 6:
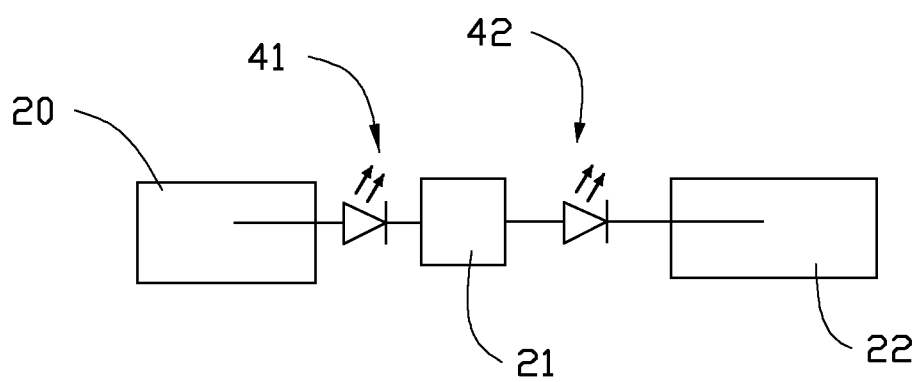
FIG. 6 is an equivalent circuit diagram of the light emitting diode package of FIG. 5.

Referring to FIGS. 5-6, a first light emitting chip 41 is mounted on the first bonding surface 201; a second light emitting chip 42 is mounted on the second bonding surface 202. The first light emitting chip 41 electrically connects with the first bonding surface 201 and the first connecting surface 211 of the first connecting electrode 21 by two wires 40, and the second light emitting chip 42 electrically connects with the second connecting surface 212 of the first connecting electrode 21 and the second connecting electrode 22 also by two wires 40. Because the first bonding surface 201 and the second bonding surface 202 are connected by the bottom end of the bonding electrode 20, and the first connecting surface 211 and the second connecting surface 212 are connected by the bottom end of the first connecting electrode 21, the first light emitting chip 41 and the second light emitting chip 42 electrically connect with each other in series, as shown in FIG. 6.

Figure 7:
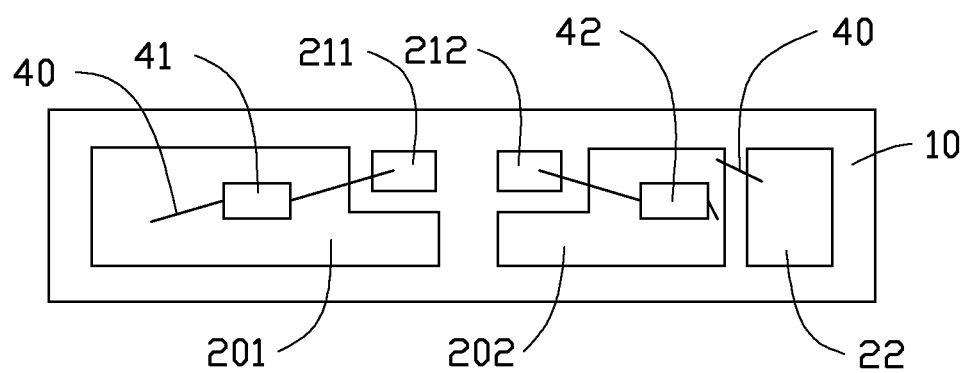
FIG. 7 is a top view of a light emitting diode package having two light emitting chips electrically connecting with each other in parallel on the lead frame of FIG. 1.
Figure 8:
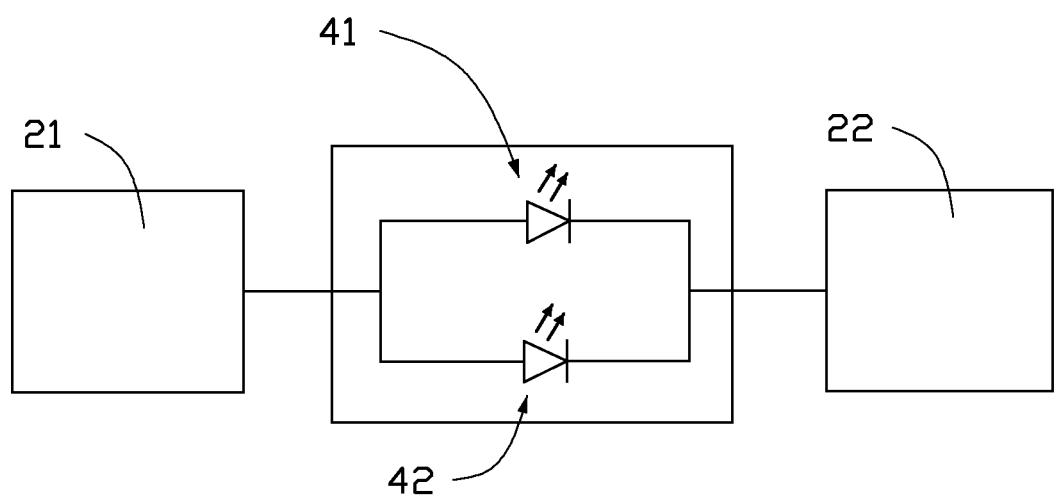
FIG. 8 is an equivalent circuit diagram of the light emitting diode package of FIG. 7.

Referring to FIGS. 7-8, the first light emitting chip 41 is mounted on the first bonding surface 201; the second light emitting chip 42 is mounted on the second bonding surface 202. The first light emitting chip 41 electrically connects with the first bonding surface 201 and the first connecting surface 211 of the first connecting electrode 21 by two wires 40, the second light emitting chip 42 electrically connects with the second connecting surface 212 and the second bonding surface 202 by two wires 40, and the second bonding surface 202 electrically connects the second connecting electrode 22 by a wire 40.

Such that, the first light emitting chip 41 and the second light emitting chip 42 electrically connect with each other in parallel, as shown in FIG. 8.

By the above disclosed configuration, because the first light emitting chip 41 and the second light emitting chip 42 can be electrically connected with each other on the lead frame 100 in series or in parallel, the electrical wiring between the first light emitting chip 41 and the second light emitting chip 42 is versatile.

Figure 9:
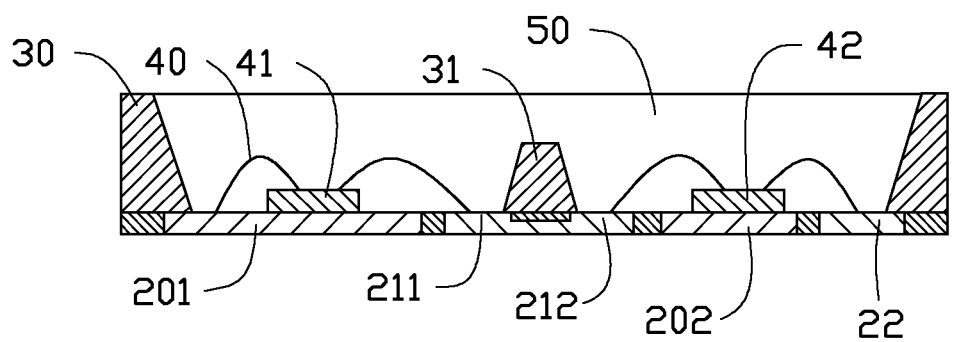
FIG. 9 is a cross-sectional view of a light emitting diode package having a reflector and two light emitting chips connecting with each other in series on the lead frame of FIG. 1.

Referring to FIG. 9, an encapsulation layer 50 is formed to cover the first light emitting chip 41, the second light emitting chip 42 and the dam 31 in the reflector 30. The encapsulation layer 50 is made of transparent materials, such as epoxy resin, silicone. The encapsulation layer 50 can be doped with phosphor powders therein. In this embodiment, light emitted from the first light emitting chip 41 and light emitted from the second light emitting chip 42 can be mixed to obtain white light.

According to the present disclosure, because the bonding electrode 20 is made of metallic materials with good thermal conductivity and the bottom surface of the bonding electrode 20 occupies more than eighty percent of the entire area of the bottom surface of the lead frame 100, heat generated from the first light emitting chip 41 and the second light emitting chip 42 can be rapidly conducted to the bottom surface of the lead frame 100 to dissipate, which increases the heat dissipating efficiency of the light emitting package.

Furthermore, because the reflector 30 and the substrate 10 are made of reflecting materials, such as EMC (Epoxy Molding Compound) or SMC (Silicone Molding Compound), the reflecting efficiency of the reflector 30 is increased. Accordingly, a light extraction efficiency of the light emitting package is increased.

Figure 10:
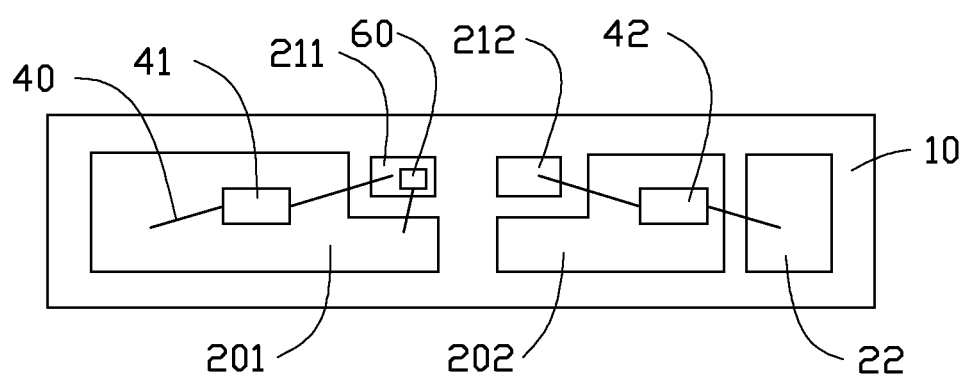
FIG. 10 is a top view of a light emitting diode package having two light emitting chips connecting with each other in series and a zener diode connecting with one of the two light emitting chips in parallel on the lead frame of FIG. 1.

Referring to FIG. 10, when the first and second light emitting chips 41, 42 electrically connect with each other in series, a zener diode 60 electrically connects with the bonding electrode 20 and the first connecting electrode 21, such that the zener diode 60 electrically connects with the first light emitting chip 41 in parallel, which makes the electrostatic damage to the first light emitting chip 41 can be avoided. In this embodiment, the zener diode 60 is mounted on the top surface of the first bonding surface 201, and electrically connects the first bonding surface 201 by a wire 40 and the first connecting surface 211 of the first connecting electrode 21 directly.

Alternatively, the zener diode 60 can be mounted on the second connecting surface 212, or on the top surface of the substrate 10.

Figure 11:
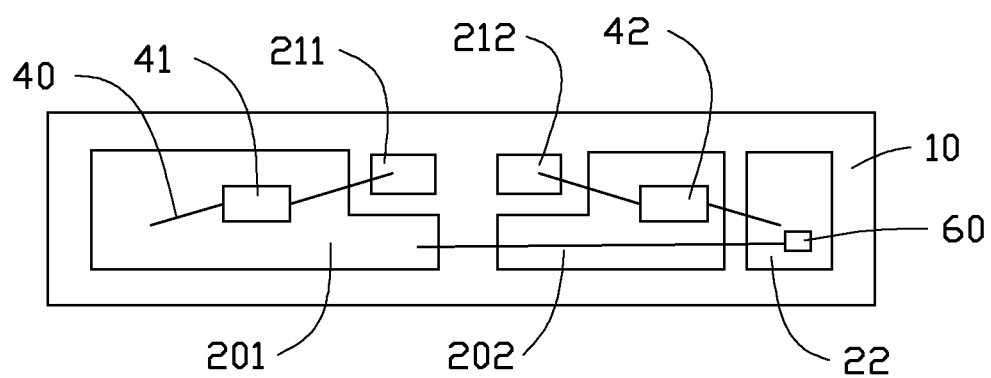
FIG. 11 is a top view of a light emitting diode package having two light emitting chips connecting with each other in series and a zener diode connecting with the two serially-connected light emitting chips in parallel on the lead frame of FIG. 1.

Referring to FIG. 11, the zener diode 60 can be mounted on the second connecting electrode 22, and electrically connects the bonding electrode 20 by a wire 40 and the second connecting electrode 22 directly, which makes the zener 60 electrically connects with the serially-connected first and second light emitting chips 41, 42 in parallel, whereby the electrostatic damage to the first and second light emitting chips 41, 42 can be avoided by the zener 60.

Figure 12:
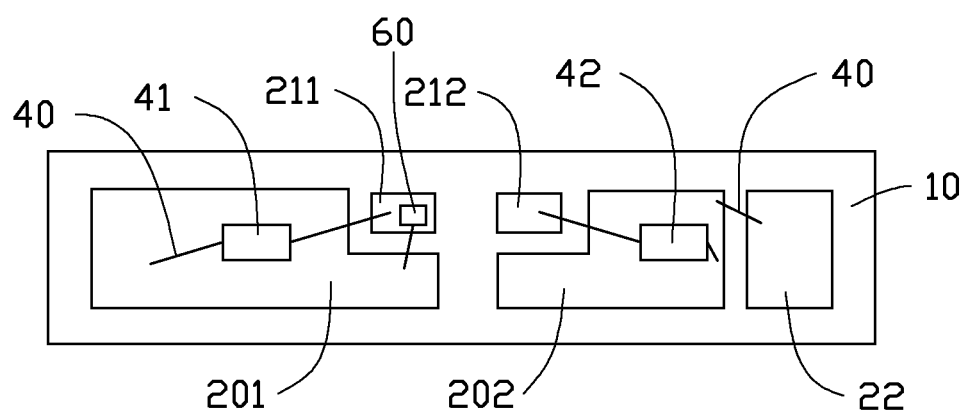
FIG. 12 is a top view of a light emitting diode package having two light emitting chips and a zener diode connecting with each other in parallel on a lead frame of FIG. 1.

Referring to FIG. 12, when the first and second light emitting chips 41, 42 electrically connect with each other to the lead frame 100 in parallel, the zener diode 60 can be provided to electrically connect with the bonding electrode 20 and the first connecting electrode 21 respectively by two wires 40, which makes the first light emitting chip 41, the second light emitting chip 41 and the zener diode 60 electrically connects with each other in parallel on the lead frame 100, whereby the electrostatic damage to the first and second light emitting chips 41, 42 can be avoided by the zener 60. In this embodiment, the zener diode 60 is mounted on the first connecting surface 211 of the first connecting electrode 21.

It is to be understood that the above-described embodiment is intended to illustrate rather than limit the disclosure. Variations may be made to the embodiment without departing from the spirit of the disclosure as claimed. The above-described embodiments illustrate the scope of the disclosure but do not restrict the scope of the disclosure.

What is claimed is:

1. A lead frame for mounting at least a first light emitting chip and a second light emitting chip thereon, comprising:
   a substrate;
   a bonding electrode embedded in the substrate;
   a first connecting electrode embedded in the substrate; and
   a second connecting electrode embedded in the substrate, the bonding electrode, the first connecting electrode and the second connecting electrode being spaced from each other, a top surface of the bonding electrode comprising a first bonding surface and a second bonding surface spaced from the first bonding surface, the first connecting electrode comprising a first connecting surface and a second connecting surface spaced from the first connecting surface, top surfaces of the bonding electrode, the first connecting electrode and the second connecting electrode being exposed out of the substrate, the first bonding surface being configured for receiving the at least a first light emitting chip thereon and the second bonding surface being configured for receiving the at least a second light emitting chip thereon,
   wherein top surfaces of the bonding electrode, and the first and second connecting electrodes are coplanar with the top surface of the substrate.

2. The lead frame of claim 1, wherein the at least a first light emitting chip is mounted on the first bonding surface of the bonding electrode, and is electrically connected with the first connecting electrode and the bonding electrode, and the at least a second light emitting chip is mounted on the second bonding surface of the bonding electrode, and is electrically connected with first connecting electrode and the second connecting electrode.

3. The lead frame of claim 2, wherein the at least a first light emitting chip is mounted on the first bonding surface of the bonding electrode, and electrically connects with the first bonding surface of the bonding electrode and the first connecting surface of the first connecting electrode, and the at least a second light emitting chip is mounted on the second bonding surface of the bonding electrode, and electrically connects with the second connecting surface of the first connecting electrode and the top surface of the second connecting electrode.

4. The lead frame of claim 1, wherein the at least a first light emitting chip is mounted on the first bonding surface of the bonding electrode, and electrically connects with the first bonding surface and one of the first and second connecting surfaces of the first connecting electrode, and the at least a second light emitting chip is mounted on the second bonding surface of the bonding electrode, and electrically connects with the second bonding surface and one of the first and second connecting surfaces of the first connecting electrode, and one of the first and second connecting surfaces of the first connecting electrode electrically connects with the second connecting electrode by a wire.

5. The lead frame of claim 1, wherein bottom surfaces of the bonding electrode, and the first and second connecting electrodes are exposed out of the bottom surface of the substrate.

6. The lead frame of claim 5, wherein the bottom surfaces of the bonding electrode, and the first and second connecting electrodes are coplanar with the bottom surface of the substrate.

7. The lead frame of claim 1, wherein the first and second bonding surfaces of the bonding electrode are spaced by a cavity recessing downwardly from the top surface of the bonding electrode without penetrating through the bonding electrode along a thickness direction of the bonding electrode.

8. The lead frame of claim 7, wherein a depth of the recess equals a half of the thickness of the bonding electrode.

9. The lead frame of claim 7, wherein the first and second connecting surfaces of the first connecting electrode are spaced by a groove recessing downwardly from the top surface of the first connecting electrode without penetrating through the first connecting electrode along a thickness direction thereof.

10. The lead frame of claim 9, wherein the cavity in the bonding electrode is aligned with the groove in the first connecting electrode, and a depth of the recess equals a depth of the groove, and a width of the recess equals a width of the groove.

11. A lead frame for mounting at least a first light emitting chip and a second light emitting chip thereon, comprising:
    a substrate;
    a bonding electrode embedded in the substrate;
    a first connecting electrode embedded in the substrate; and
    a second connecting electrode embedded in the substrate, the bonding electrode, the first connecting electrode and the second connecting electrode being spaced from each other, a top surface of the bonding electrode comprising a first bonding surface and a second bonding surface spaced from the first bonding surface, the first connecting electrode comprising a first connecting surface and a second connecting surface spaced from the first connecting surface, top surfaces of the bonding electrode, the first connecting electrode and the second connecting electrode being exposed out of the substrate, the first bonding surface being configured for receiving the at least a first light emitting chip thereon and the second bonding surface being configured for receiving the at least a second light emitting chip thereon, and
    wherein bottom surfaces of the bonding electrode, and the first and second connecting electrodes are exposed out of the bottom surface of the substrate.

12. A lead frame for mounting at least a first light emitting chip and a second light emitting chip thereon, comprising:
    a substrate;
    a bonding electrode embedded in the substrate;
    a first connecting electrode embedded in the substrate; and
    a second connecting electrode embedded in the substrate, the bonding electrode, the first connecting electrode and the second connecting electrode being spaced from each other, a top surface of the bonding electrode comprising a first bonding surface and a second bonding surface spaced from the first bonding surface, the first connecting electrode comprising a first connecting surface and a second connecting surface spaced from the first connecting surface, top surfaces of the bonding electrode, the first connecting electrode and the second connecting electrode being exposed out of the substrate, the first bonding surface being configured for receiving the at least a first light emitting chip thereon and the second bonding surface being configured for receiving the at least a second light emitting chip thereon, and wherein the first and second bonding surfaces of the bonding electrode are spaced by a cavity recessing downwardly from the top surface of the bonding electrode without penetrating through the bonding electrode along a thickness direction of the bonding electrode.

\* \* \* \* \*